(12) United States Patent
Stolpman

(10) Patent No.: US 7,649,426 B2
(45) Date of Patent: Jan. 19, 2010

(54) APPARATUS AND METHOD FOR TEMPERATURE COMPENSATION OF CRYSTAL OSCILLATORS

(75) Inventor: James L. Stolpman, Bloomingdale, IL (US)

(73) Assignee: CTS Corporation, Elkhart, IN (US)

( * ) Notice: Subject to any disclaimer, the term of this patent is extended or adjusted under 35 U.S.C. 154(b) by 58 days.

(21) Appl. No.: 11/899,109

(22) Filed: Sep. 4, 2007

(65) Prior Publication Data

US 2008/0061899 A1    Mar. 13, 2008

Related U.S. Application Data

(60) Provisional application No. 60/843,982, filed on Sep. 12, 2006.

(51) Int. Cl.
  *H03L 1/00* (2006.01)
(52) U.S. Cl. .......................... 331/176; 331/65; 331/66; 331/68; 331/69; 331/70; 331/116 R; 331/116 FE; 331/154; 331/158; 331/160; 331/175
(58) Field of Classification Search .................. 331/65, 331/66, 68–70, 116 R, 116 FE, 154, 158, 331/160, 175, 176
  See application file for complete search history.

(56) References Cited

U.S. PATENT DOCUMENTS

| 3,531,739 | A |   | 9/1970  | Groves |
| 3,581,239 | A | * | 5/1971  | Knutson ................... 332/124 |
| 3,619,806 | A |   | 11/1971 | Phillips |
| 3,641,461 | A | * | 2/1972  | Mrozek ................. 331/116 R |
| 3,879,992 | A |   | 4/1975  | Bartera |
| 4,000,643 | A | * | 1/1977  | Pearson ....................... 73/708 |
| 4,051,446 | A | * | 9/1977  | Owaki ................... 331/116 R |
| 4,055,816 | A |   | 10/1977 | Woskow |
| 4,072,912 | A | * | 2/1978  | Pradal ..................... 331/116 R |
| 4,079,280 | A |   | 3/1978  | Kusters et al. |
| 4,096,452 | A | * | 6/1978  | Waku et al. ............. 331/116 R |
| 4,160,183 | A |   | 7/1979  | Kusters et al. |

(Continued)

FOREIGN PATENT DOCUMENTS

EP       1 411 630       4/2004

(Continued)

OTHER PUBLICATIONS

Villafuerte, Abrego, PCT International Search Report mailed Sep. 4, 2008. re: International Application No. PCT/US2007/019359.

(Continued)

*Primary Examiner*—Arnold Kinkead
*Assistant Examiner*—Richard Tan
(74) *Attorney, Agent, or Firm*—Daniel J. Deneufbourg; Mark P. Bourgeois

(57) ABSTRACT

An oscillator includes an oscillator circuit and a resonator that produces an output frequency. A temperature compensation circuit is coupled to the oscillator circuit. The temperature compensation circuit stabilizes the output frequency in response to changes in temperature. At least one temperature sensor and a temperature sensor signal modification circuit are coupled to the temperature compensation circuit. The temperature sensor signal modification circuit receives a temperature signal from the temperature sensor and generates a modified temperature sensor signal that is transmitted to the temperature compensation circuit.

13 Claims, 7 Drawing Sheets

U.S. PATENT DOCUMENTS

| | | | |
|---|---|---|---|
| 4,254,382 A | | 3/1981 | Keller et al. |
| 4,259,606 A | | 3/1981 | Vig |
| 4,302,731 A | * | 11/1981 | Ashida .................. 331/116 R |
| 4,492,933 A | | 1/1985 | Grieco |
| 4,525,647 A | | 6/1985 | Dworsky |
| 4,532,468 A | * | 7/1985 | Nishida et al. .............. 323/367 |
| 4,537,515 A | | 8/1985 | Dinger et al. |
| 4,587,497 A | | 5/1986 | Keller et al. |
| 4,607,237 A | * | 8/1986 | Aota ..................... 331/116 R |
| 4,611,182 A | | 9/1986 | Chauvin et al. |
| 4,922,212 A | | 5/1990 | Roberts et al. |
| 4,937,537 A | | 6/1990 | Nyqvist |
| 4,985,687 A | | 1/1991 | Long |
| 5,004,988 A | * | 4/1991 | Ueno et al. ............ 331/116 R |
| 5,041,799 A | | 8/1991 | Pirez |
| 5,041,800 A | | 8/1991 | Long et al. |
| 5,081,431 A | | 1/1992 | Kubo et al. |
| 5,097,228 A | | 3/1992 | McJunkin |
| 5,214,668 A | | 5/1993 | Satou et al. |
| 5,428,319 A | | 6/1995 | Marvin et al. |
| 5,473,289 A | * | 12/1995 | Ishizaki et al. .............. 331/176 |
| 5,530,403 A | | 6/1996 | Bushman et al. |
| 5,604,465 A | | 2/1997 | Farabaugh |
| 5,604,466 A | | 2/1997 | Dreps et al. |
| 5,604,468 A | | 2/1997 | Gillig |
| 5,659,270 A | | 8/1997 | Millen et al. |
| 5,668,506 A | * | 9/1997 | Watanabe et al. ............. 331/66 |
| 5,691,671 A | | 11/1997 | Bushman |
| 5,696,423 A | | 12/1997 | Dydyk et al. |
| 5,719,782 A | | 2/1998 | Mitsuoka |
| 5,731,742 A | | 3/1998 | Wojewoda et al. |
| 5,740,525 A | | 4/1998 | Spears |
| 5,760,656 A | | 6/1998 | Sutliff et al. |
| 5,777,524 A | | 7/1998 | Wojewoda et al. |
| 5,781,075 A | | 7/1998 | Bolton et al. |
| 5,805,028 A | * | 9/1998 | Kato ..................... 331/116 R |
| 5,883,550 A | * | 3/1999 | Watanabe et al. ........... 331/176 |
| 5,909,160 A | | 6/1999 | Dick et al. |
| 5,912,595 A | | 6/1999 | Ma et al. |
| 5,917,272 A | | 6/1999 | Clark et al. |
| 5,926,778 A | | 7/1999 | Poppel |
| 5,940,027 A | | 8/1999 | Forseth et al. |
| 5,977,839 A | | 11/1999 | Tsumura |
| 5,999,063 A | | 12/1999 | Sakurai et al. |
| 6,040,744 A | | 3/2000 | Sakurai et al. |
| 6,121,848 A | | 9/2000 | Sauer |
| 6,127,661 A | | 10/2000 | Fry |
| 6,160,458 A | * | 12/2000 | Cole et al. .................. 331/158 |
| 6,208,215 B1 | | 3/2001 | Sauer |
| 6,259,333 B1 | * | 7/2001 | Shimono ................ 331/116 R |
| 6,292,066 B1 | * | 9/2001 | Shibuya et al. .............. 331/176 |
| 6,342,798 B1 | | 1/2002 | Yoshida |
| 6,362,699 B1 | | 3/2002 | Fry |
| 6,362,700 B1 | | 3/2002 | Fry |
| 6,366,175 B2 | * | 4/2002 | Oka ...................... 331/116 R |
| 6,501,340 B1 | | 12/2002 | Flood |
| 6,509,870 B1 | | 1/2003 | Matsushita et al. |
| 6,515,548 B2 | | 2/2003 | Matsumoto et al. |
| 6,518,847 B1 | | 2/2003 | Sauer |
| 6,522,212 B1 | | 2/2003 | Kodim |
| 6,522,871 B1 | | 2/2003 | Patrick et al. |
| 6,542,044 B1 | | 4/2003 | Berquist et al. |
| 6,545,550 B1 | | 4/2003 | Frerking |
| 6,570,461 B1 | | 5/2003 | Fry et al. |
| 6,577,201 B2 | | 6/2003 | Ho et al. |
| 6,603,364 B2 | | 8/2003 | Nemoto |
| 6,621,361 B1 | | 9/2003 | Fry |
| 6,630,872 B1 | | 10/2003 | Lanoue et al. |
| 6,710,663 B1 | | 3/2004 | Berquist |
| 6,731,180 B1 | | 5/2004 | Clark et al. |
| 6,731,181 B2 | | 5/2004 | Fukayama et al. |
| 6,819,194 B2 | * | 11/2004 | Toncich et al. .............. 331/158 |
| 6,946,919 B2 | | 9/2005 | Knecht et al. |
| 6,995,622 B2 | * | 2/2006 | Partridge et al. .............. 331/66 |
| 7,205,858 B2 | * | 4/2007 | Kato ......................... 331/158 |
| 7,248,127 B2 | * | 7/2007 | Ishikawa et al. ............ 331/158 |
| 7,253,694 B2 | | 8/2007 | Hardy et al. |
| 2001/0017574 A1 | | 8/2001 | Oka |
| 2001/0048349 A1 | | 12/2001 | Matsumoto et al. |
| 2002/0158700 A1 | | 10/2002 | Nemoto |
| 2002/0180544 A1 | | 12/2002 | Fukayama et al. |
| 2003/0174025 A1 | | 9/2003 | Ho et al. |
| 2003/0184399 A1 | | 10/2003 | Lanoue et al. |
| 2003/0197567 A1 | | 10/2003 | Villella |
| 2003/0225514 A1 | | 12/2003 | Lokshin et al. |
| 2006/0132254 A1 | | 6/2006 | Routama et al. |
| 2007/0096839 A1 | | 5/2007 | Meissner |
| 2008/0012655 A1 | | 1/2008 | Stolpman |

FOREIGN PATENT DOCUMENTS

| | | |
|---|---|---|
| GB | 2 412 037 | 9/2005 |
| JP | 55093031 | 1/1979 |
| JP | 1277993 | 11/1989 |
| JP | 4086023 | 7/1990 |
| JP | 4096506 | 8/1990 |
| JP | 4363913 | 12/1992 |
| JP | 2000 036739 | 2/2000 |

OTHER PUBLICATIONS

Villafuerte, Abrego, PCT Written Opinion of the International Searching Authority mailed Sep. 4, 2008 re: PCT International Application No. PCT/US2007/019359.

Micro Analog Systems Oy (MAS), 12 × 8-Bit D to A Converter, part specification and description, Feb. 23, 2005, pp. 1-10, Micro Analog Systems Oy, Espoo, Finland.

Bob Parkins, Sales Manager, Lap-Tech Inc., Stress Compensated Quartz Resonators, article reprinted from EP&T Magazine, Jan.-Feb. 2005, Lap-Tech Inc., Bowmanville, Ontario, Canada.

Mark A. Haney, Design Technique for Analog Temperature Compensation of Crystal Oscillators, thesis submitted to the faculty of the Virginia Polytechnic Institute and State University, copyright 2001, pp. i-viii and 9-55, Mark Haney, Blacksburg, Virginia, U.S.A.

\* cited by examiner

APPARATUS AND METHOD FOR TEMPERATURE COMPENSATION OF CRYSTAL OSCILLATORS

CROSS-REFERENCE TO RELATED APPLICATION

This application claims the benefit of the filing date of U.S. Provisional Application Ser. No. 60/843,982 filed on Sep. 12, 2006, which is explicitly incorporated herein by reference as are all references cited therein.

FIELD OF THE INVENTION

This invention relates to oscillators that provide a stable reference frequency signal in electronic equipment and, more specifically, to an improved temperature compensation circuit for crystal oscillators.

DESCRIPTION OF THE RELATED ART

Oscillators are well known for providing a reference frequency or source and include a quartz crystal or other resonator and electronic compensation circuitry to stabilize the output frequency.

Various methods are known to stabilize the output frequency as the temperature of the oscillator changes. Temperature compensated crystal oscillators (TCXOs) typically employ a thermistor for generating a correction voltage which reduces the frequency variation over temperature. The correction voltage is usually applied to a varactor diode in the crystal circuit such that the crystal frequency may be varied by a small amount.

Although TCXO stability can approach 0.5 PPM, a TCXO that resides at one temperature extreme for an extended period of time may exhibit a frequency shift when returned to normal room temperature. Although this hysteresis or "retrace" error is usually temporary, a permanent offset is not uncommon. Retrace errors are usually less than about 0.5 PPM but can be much higher, particularly where the mechanical tuning device (trimmer capacitor or potentiometer) is shifting. This hysteresis makes the manufacture of TCXOs with specifications approaching 0.1 PPM quite difficult.

TCXOs are preferred to oven oscillators in at least two applications, i.e., low power applications or applications where a warm-up period is not acceptable. The only warm-up time is the time required for the components to reach thermal equilibrium. Total current consumption can be very low and is determined by the output signal power requirements. Older TCXO designs employ a thermistor to flatten the crystal temperature frequency curve. Newer designs employ digital logic or a microprocessor to derive a correction voltage from values or coefficients stored in memory.

In a conventional TCXO, a temperature sensor is typically positioned within the oscillator package and is used to provide a signal to a temperature compensation circuit. In the conventional TCXO, the temperature sensor is often located either away from the crystal or the crystal may be mounted in a vacuum enclosure.

Where the crystal is mounted in a vacuum enclosure, the temperature of the crystal will experience a thermal lag relative to the temperature of the ambient environment. The result is that the temperature sensor produces an inaccurate output reading of the instantaneous crystal temperature and thus a more unstable output frequency.

A need thus exists for an oscillator circuit that has improved frequency stability over changes in temperature.

SUMMARY OF THE INVENTION

It is a feature of the invention to provide an oscillator that includes an oscillator circuit and a resonator connected to the oscillator circuit. The oscillator circuit produces an output frequency. A temperature compensation circuit is connected to the oscillator circuit. The temperature compensation circuit stabilizes the output frequency in response to changes in temperature. At least one temperature sensor and a temperature sensor signal modification circuit are connected to the temperature compensation circuit. The temperature sensor signal modification circuit receives a first temperature signal from the temperature sensor and generates a modified temperature sensor signal that is transmitted to the temperature compensation circuit.

The present invention also provides a method of temperature compensating an oscillator. The method initially includes providing an oscillator circuit that is in communication with a resonator. A reference frequency is generated from the oscillator. A first temperature is sensed on one side of the resonator. Optionally, a second temperature may be sensed on the opposite side of the resonator in proximity to the oscillator circuit. A modified temperature sensor signal is generated from the sensed first and optional second temperatures. A temperature compensation voltage is generated from the modified temperature sensor signal. The reference frequency is adjusted using the temperature compensation voltage.

It is understood, of course, that the invention resides not in any one of these features per se but rather in the particular combination of the features disclosed and claimed herein. Those skilled in the art will appreciate that the conception upon which this disclosure is based may readily be utilized as a basis for the designing of other structures, methods and systems for carrying out the several purposes of the present invention.

BRIEF DESCRIPTION OF THE DRAWINGS

These and other features of the invention can best be understood by the following description of the accompanying drawings as follows.

It is noted that the drawings of the invention are not to scale. The invention will be described with additional specificity and detail through the accompanying detailed description.

DETAILED DESCRIPTION

Figure 1:
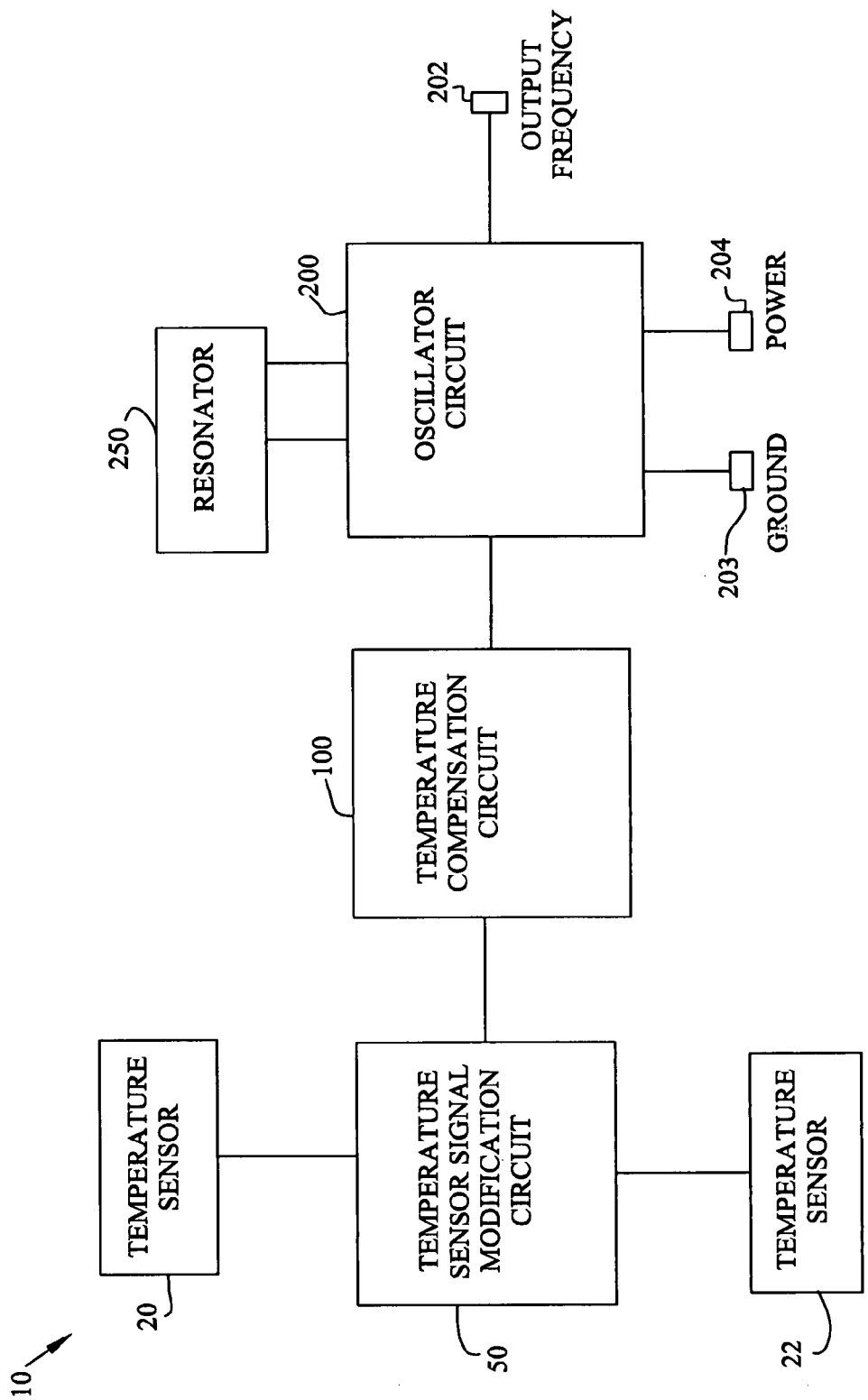
FIG. 1 is a block flow diagram of one embodiment of a temperature compensated crystal oscillator (TCXO) package in accordance with the present invention utilizing two temperature sensors.

FIG. 1 depicts a block flow diagram of a temperature compensated crystal oscillator (TCXO) package using a temperature sensor signal modification circuit in accordance with the present invention.

In the embodiment of FIG. 1, TCXO oscillator package 10 includes two temperature sensors 20 and 22 that are connected to a temperature sensor signal modification circuit 50. Temperature sensors 20 and 22 can be conventional negative coefficient thermistors (NCT) that change resistance in response to a change in temperature. Temperature sensor signal modification circuit 50 receives temperature sensor signals from each of the temperature sensors 20 and 22 and generates a modified temperature sensor signal.

Although FIG. 1 depicts the use of two temperature sensors, it is understood that the invention encompasses embodiments which include only one temperature sensor and embodiments which include more than two temperature sensors.

Temperature compensation circuit 100 is connected to temperature sensor signal modification circuit 50. Temperature compensation circuit 100 receives the modified temperature sensor signal from the temperature sensor signal modification circuit 50 and generates a compensation voltage.

An oscillator circuit 200 is connected to temperature compensation circuit 100. A resonator 250 is in turn coupled to the oscillator circuit 200. Oscillator circuit 200 can be any type of oscillator circuit that uses any type of resonator. For example, oscillator circuit 200 can be a Colpitts oscillator circuit using an AT cut quartz crystal resonator. Resonator 250 could also be a mesa type crystal or other bulk resonator such as lithium niobate.

Oscillator circuit 200 receives the compensation voltage from temperature compensation circuit 100 and uses the compensation voltage to adjust the oscillator output frequency according to changes in temperature. Oscillator 200 generates and provides a stable reference frequency at output terminal 202. Power supply terminal 204 supplies oscillator 100 with power and terminal 203 is connected to ground.

Oscillator Package

Figure 2:
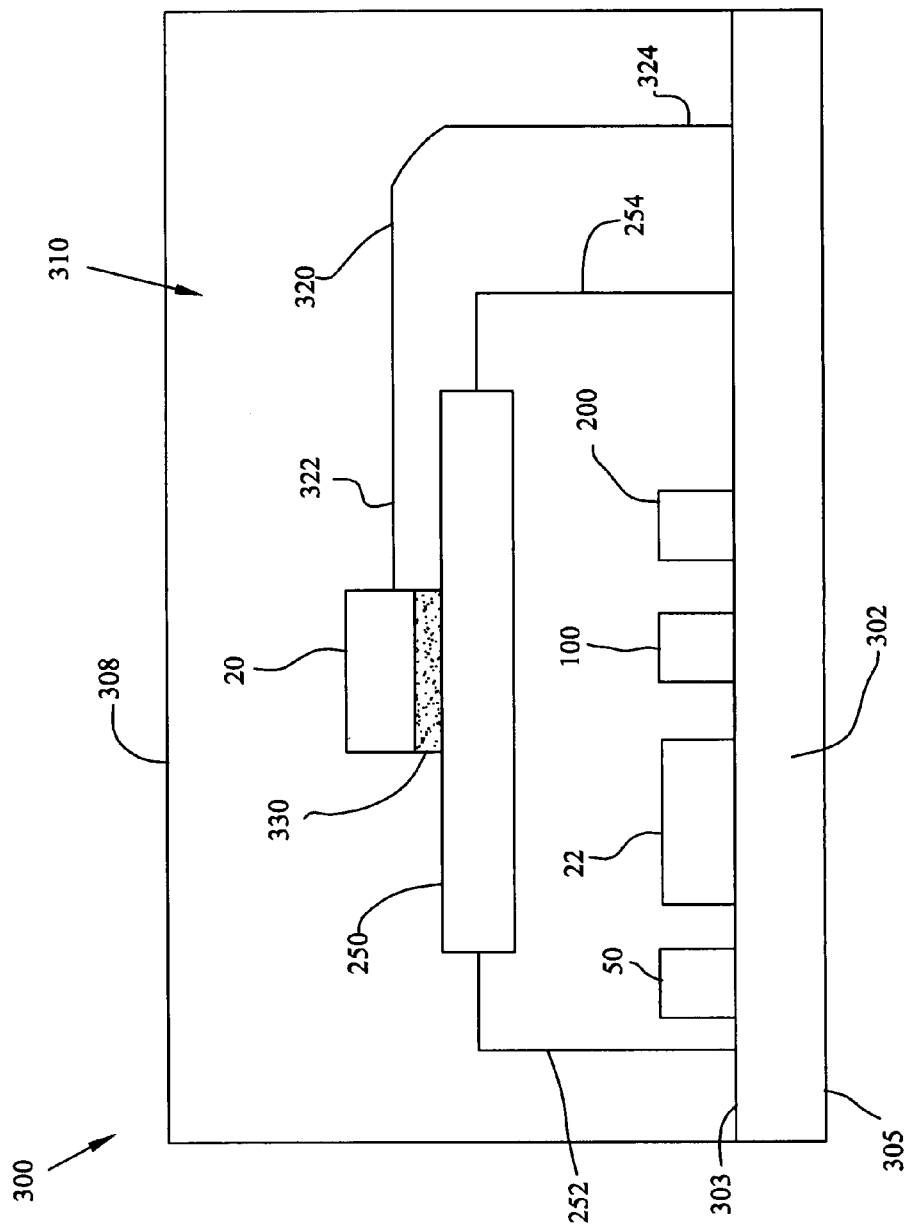
FIG. 2 is an enlarged, simplified, schematic side elevational view of one physical embodiment of the oscillator package in accordance with the present invention.

FIG. 2 is a simplified, side elevational view of one physical embodiment of an oscillator package 300 in accordance with the present invention utilizing two temperature sensors.

Oscillator package 300 includes a printed circuit board 302. Printed circuit board 302 has a top surface 303 and a bottom surface 305. Printed circuit board 302 is a conventional printed circuit board and can include circuit lines, plated through-holes, and mounting pads (not shown) in order to electrically connect the oscillator components. A cover or lid 308 can be mounted to printed circuit board 302 for covering and protecting the oscillator components mounted to the top surface 303 of printed circuit board 302. Cover 308 defines an interior oscillator package cavity 310.

Temperature sensor 22, temperature sensor signal modification circuit 50, temperature compensation circuit 100 and oscillator 200 are all mounted to printed circuit board top surface 303 by soldering to mounting pads (not shown). Alternatively, a conductive epoxy can be used to attach the oscillator components to the printed circuit board.

Resonator 250 is located above, and in spaced, generally parallel relationship to, the top surface 303 of printed circuit board 302. Resonator 250 overlies the oscillator elements 22, 50, 100, and 200 and has wire leads 252 and 254 extending from opposite ends thereof and adapted to be soldered to respective mounting pads (not shown) on top surface 303 of printed circuit board 302. Alternatively, wire leads 252 and 254 can be soldered into a plated through-hole (not shown). Resonator 250 can be an AT cut quartz crystal enclosed in a vacuum.

Temperature sensor 20 is seated on and mounted to the top surface of resonator 250 with an adhesive 330. Adhesive 330 can be any conventional adhesive. A flexible cable 320 is coupled to temperature sensor 20. Flexible cable 320 has ends 322 and 324. End 324 is adapted to be soldered to printed circuit board top surface 303 and end 322 is adapted to be soldered to temperature sensor 20.

Temperature sensor 20 is adapted to accurately measure the temperature of resonator 250 because it is mounted adjacent thereto. Temperature sensor 22 is mounted to printed circuit board 302 in an adjacent relationship to temperature compensation circuit 100 and oscillator circuit 200. Temperature sensor 22 is thermally coupled to printed circuit board 302. Temperature sensor 22 is more closely coupled to the temperature environment outside of oscillator package 300 than is temperature sensor 20.

Temperature Sensor Signal Modification Circuit

Figure 3:
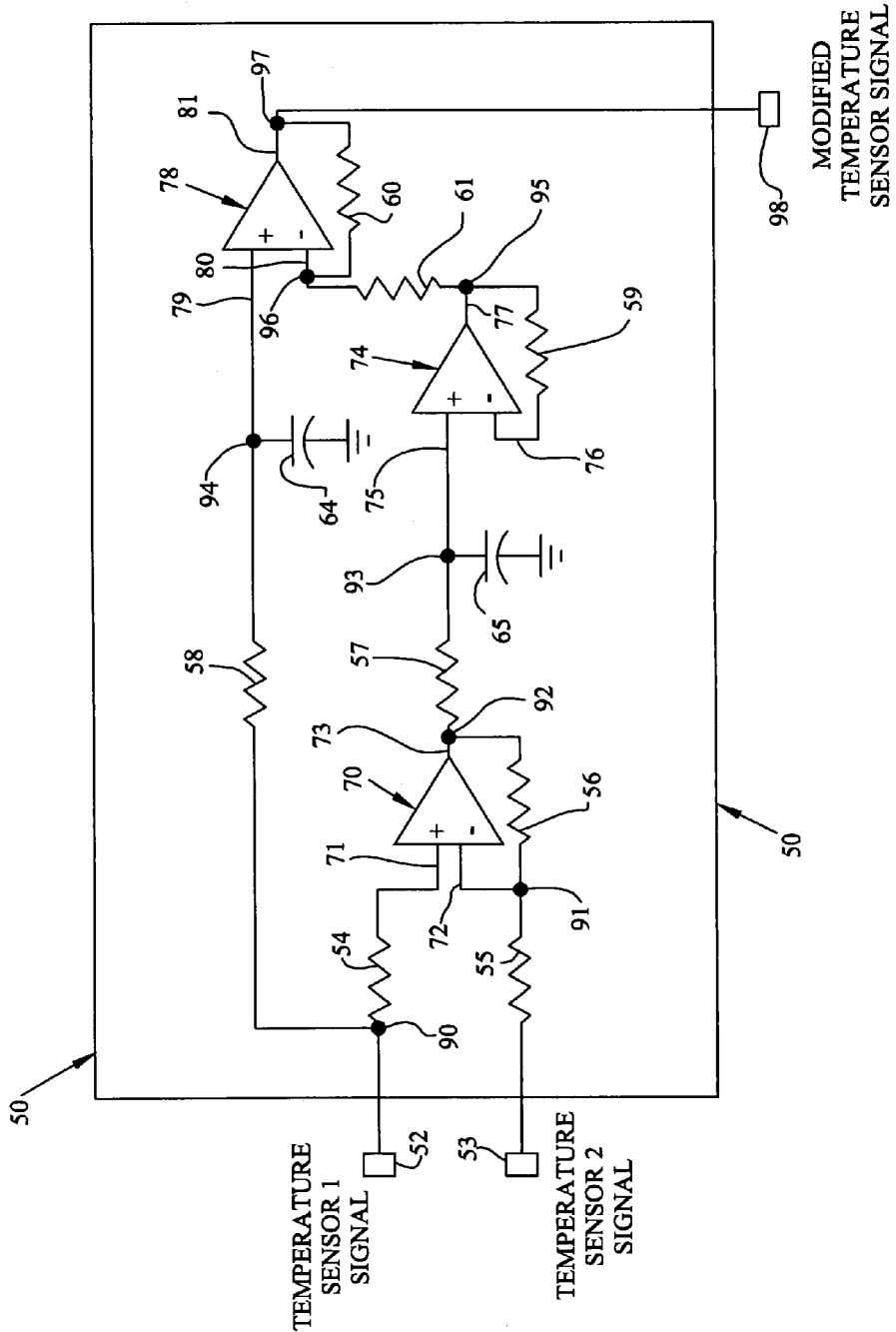
FIG. 3 is a schematic of the temperature sensor signal modification circuit of the TCXO package of the present invention.

FIG. 3 is a schematic of the temperature sensor signal modification circuit 50 of the TCXO package of the present invention utilizing two temperature sensors.

Temperature sensor signal modification circuit 50 can include temperature sensor terminals 52 and 53 and a modified temperature sensor signal terminal 98.

Temperature sensor terminal 52 is connected to node 90 and temperature sensor terminal 53 is connected to resistor 55. Node 90 is connected to resistors 54 and 58.

Temperature sensor signal modification circuit 50 also includes three operational amplifiers 70, 74 and 78. Operational amplifier 70 has input terminals 71 and 72 and an output terminal 73. Input terminal 71 is connected to resistor 54 which, in turn, is coupled to node 90. Input terminal 72 is connected to node 91. Output terminal 73 is connected to node 92. Resistor 56 is connected between node 91 and node 92. Resistor 57 is connected between node 92 and node 93. Capacitor 65 is connected between node 93 and ground. Resistor 58 is connected between node 90 and node 94. Capacitor 64 is connected between node 94 and ground.

Operational amplifier 74 has input terminals 75 and 76 and an output terminal 77. Input terminal 75 is connected to node 93. Input terminal 76 is connected to resistor 59. Output terminal 77 is connected to node 95. Resistor 59 is connected between node 95 and input terminal 76.

Operational amplifier 78 has input terminals 79 and 80 and an output terminal 81. Input terminal 79 is connected to node 94 and input terminal 80 is connected to node 96. Resistor 61 is connected between node 95 and node 96. Output terminal 81 is connected to node 97. Resistor 60 is connected between node 96 and node 97. Node 97 is connected to output terminal 98.

Temperature sensor signal modification circuit 50 receives first and second temperature sensor signals at terminals 52 and 54 and generates a modified temperature sensor signal at terminal 98.

The voltage from temperature sensor 20 is applied through the terminal 52 to the input terminal 71 of operational amplifier 70. The voltage from temperature sensor 22 is applied through the terminal 53 to the input terminal 72 of operational amplifier 70. Operational amplifier 70 produces an electrical signal at terminal 73 that is proportional to the difference in the temperature that is sensed by temperature sensors 20 and 22.

Operational amplifier 70 will therefore have a known fixed output voltage when the temperature sensor signals are equal and have an output voltage that varies from a nominal value in either a positive or negative direction when a temperature difference is detected. The output voltage at terminal 73 is filtered by the combination of resistor 57 and capacitor 65 to provide a lagging voltage that is used as a reference voltage by operational amplifier 78 at input terminal 80.

The voltage from temperature sensor 20 is also applied to input terminal 79 of operational amplifier 78 through terminal 52 and resistor 58. The output voltage of operational amplifier 78 at terminal 98 or the modified temperature sensor signal will have a value that more closely or accurately represents the actual resonator temperature.

When the temperatures sensed by temperature sensors 20 and 22 are the same, the voltage at input terminal 80 will be zero and will have no effect on the voltage produced by operational amplifier 78. The voltage output will be the same as produced by temperature sensor 20.

If temperature sensor 22 senses a rising temperature, the voltage at terminal 53 will increase. If temperature sensor 22 senses a temperature increase that is faster or greater than the temperature increase at temperature sensor 20, then operational amplifier 70 will detect the signal or voltage difference between sensors 20 and 22 and apply the differential voltage to capacitor 65 through resistor 57. The RC time constant for capacitor 65 and resistor 57 can be chosen to approximate the thermal lag time between the temperature of sensor 22 and the temperature of resonator 250. Resistor 57 can be a programmable resistor integrated on an IC to provide adjustments.

Because temperature sensor 22 is connected to input terminal 72 through resistor 55, the output of operational amplifier 70 will become slightly negative and will slowly shift the voltage at input terminal 80 to become more positive thereby indicating an increase in the temperature of resonator 250.

If temperature sensor 20 senses a rising temperature and the voltage at terminal 52 increases, the voltage will be filtered through capacitor 64 and resistor 58. This also causes a gradual increase in the voltage at the output terminal 77 of operational amplifier 74.

The RC time constant for capacitor 64 and resistor 58 can be chosen to approximate the thermal lag time between the temperature of sensor 20 and the temperature of resonator 250. Resistor 58 can be a programmable resistor integrated on an IC to provide adjustments.

It is not necessary that the thermal temperature lag times between sensors 20 and 22 and resonator 250 be equal. Either of sensors 20 or 22 can be above or below the resonator temperature and the output of circuit 50 will provide an accurate reading of the temperature of resonator 250.

Oscillator Circuit

Figure 4:
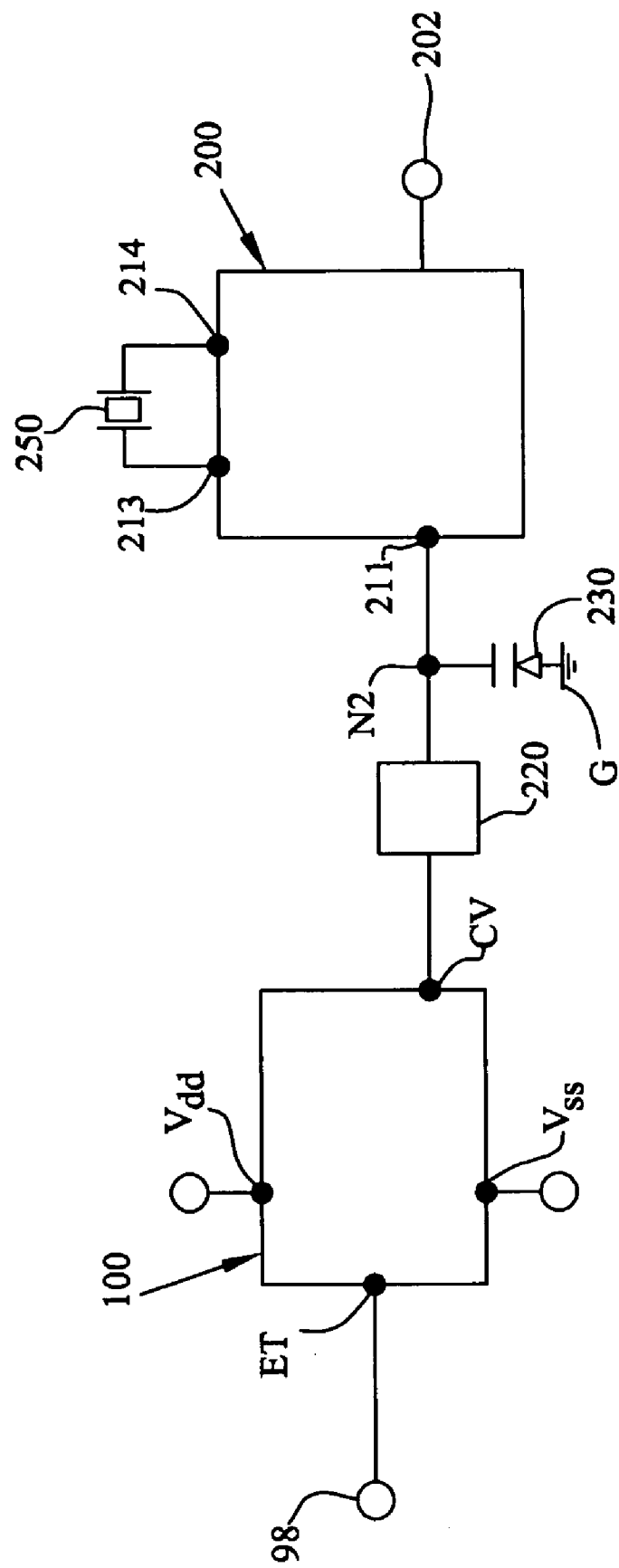
FIG. 4 is a schematic of the TCXO circuit of the TCXO package of the present invention.

FIG. 4 is a schematic diagram of an embodiment of a temperature compensated crystal oscillator (TCXO) including temperature compensation circuit 100 and oscillator circuit 200.

Temperature compensation circuit 100 can be an integrated circuit that is designed to be used with oscillators. The integrated circuit can be a part number AK2151 integrated circuit that is commercially available from Asahi Kasei Microsystems Co., Ltd. of Tokyo, Japan. Temperature compensation circuit 100 can be used with an AT cut quartz crystal resonator.

Temperature compensation circuit 100 can contain an internal oscillator circuit and temperature sensor (not shown). Where an internal oscillator circuit is used, oscillator circuit 200 can be omitted. Where an internal temperature sensor is used, temperature sensor 22 can be omitted. Temperature compensation circuit 100 can operate as a TCXO with only the addition of a resonator or crystal.

Temperature compensation circuit 100 includes terminals Vdd, CV, Vss, and ET. Terminal Vdd is connected to a 3.3 volt power source and terminal Vss is connected to ground G. External temperature terminal ET is connected to terminal 98 and receives the modified temperature sensor signal from temperature sensor signal modification circuit 50.

Oscillator circuit 200 is connected to temperature compensation circuit 100 through terminal CV. Oscillator circuit 200 can be a conventional oscillator circuit such as a Pierce or Colpitts oscillator circuit as will be discussed later in FIG. 5. Oscillator circuit 200 has terminals 202, 211, 213, and 214. Terminal 211 is connected to node N2. Terminals 213 and 214 are connected across resonator 250 and couple the resonator to the oscillator circuit 200. Terminal 202 is the output frequency terminal.

A varactor diode 230 is connected between ground G and node N2. Varactor diode 230 has an adjustable capacitance that can be used to tune the operating frequency of the oscillator. Node N2 is connected to terminal 211 of oscillator circuit 200. A low pass filter 220 is connected between node N2 and control voltage terminal CV of temperature compensated circuit 100. Low pass filter 220 delays the correction voltage supplied to varactor diode 230 to better match the thermal profile of resonator 250. Resonator 250 is coupled to oscillator circuit 200 at oscillator circuit terminals 213 and 214.

Temperature compensation circuit 100 uses the modified temperature signal from terminal 98 and received at terminal ET of temperature compensation circuit 100 to generate a temperature compensation voltage at terminal CV. The temperature compensation voltage is used to adjust the reference frequency produced by oscillator circuit 200 at terminal 202 thereof. The temperature compensation circuit 100 maintains the reference frequency within a tight tolerance.

Figure 5:
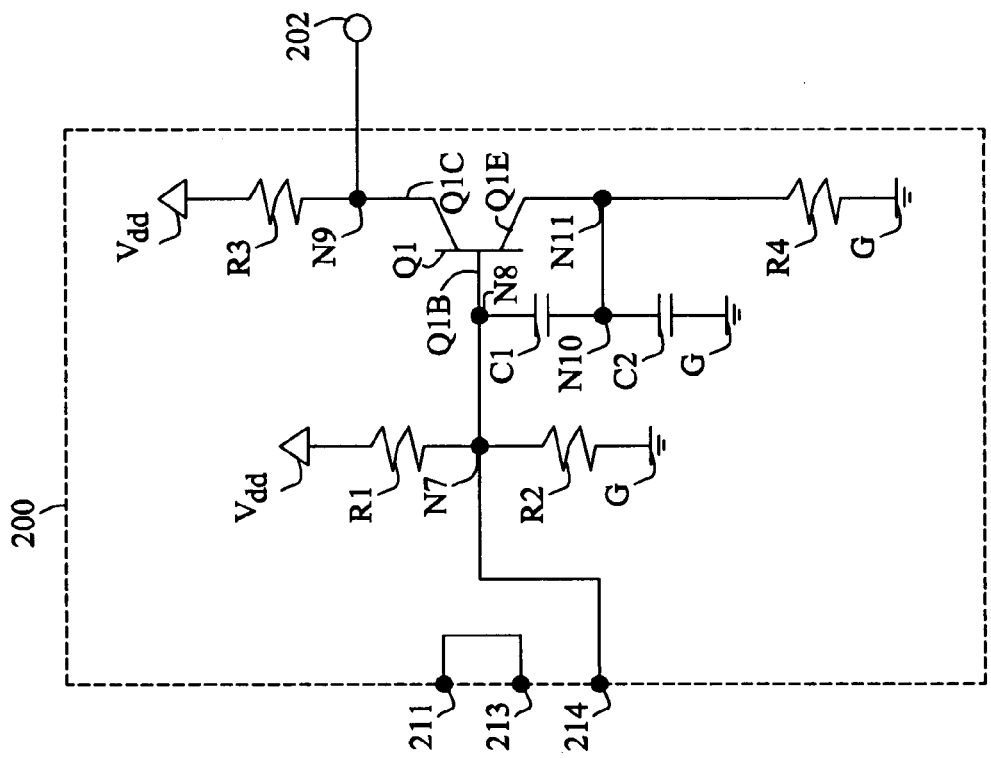
FIG. 5 is a schematic of the Colpitts oscillator circuit of the TCXO package of the present invention.

FIG. 5 depicts the Colpitts oscillator circuit 200 of FIG. 4 in more schematic detail. Oscillator circuit 200 includes a transistor Q1 that has a base Q1B, a collector Q1C and an emitter Q1E. Base Q1B is connected to node N8. Collector Q1C is connected to node N9 and resistor R3 which, in turn, is connected to power supply Vdd. Node N9 is further connected to output terminal 202. Emitter Q1E is connected to Node N11 which, in turn, is connected to resistor R4. Resistor R4 is, in turn, connected to ground G. Capacitor C1 is connected between node N8 and node N10. Capacitor C2 is connected between node N10 and ground G. Nodes N10 and N11 are connected.

Resistor R1 is connected between node N7 and power supply Vdd. Resistor R2 is connected between node N7 and ground. Node N7 is connected to terminal 214.

With reference back to FIG. 1, during the operation of TCXO oscillator package 10, temperature sensors 20 and 22 generate temperature sensor signals that are proportional to the temperatures to which the sensors are exposed. The temperature sensor signals are received by temperature sensor signal modification circuit 50. Temperature sensor signal modification circuit 50 generates a modified temperature sensor signal that is provided to temperature compensation circuit 100.

Temperature compensation circuit 100 uses the modified temperature sensor signal to adjust the output frequency that is produced by oscillator circuit 100 at terminal 202. The temperature compensation circuit maintains the output frequency within a tolerance range with changes in temperature.

Operation

Figure 6:
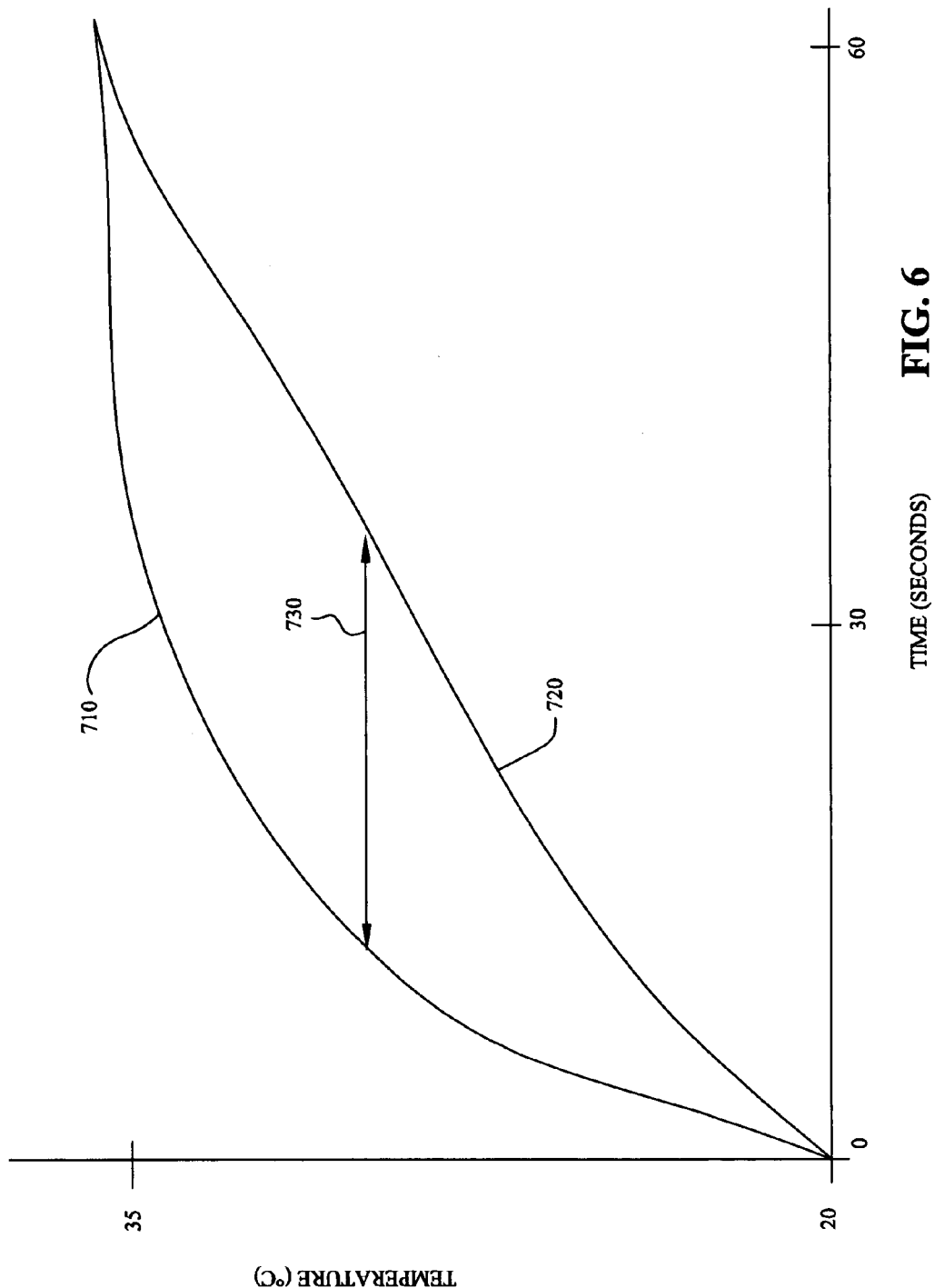
FIG. 6 is a graph of the temperature versus time characteristics of the TCXO package of the present invention.

FIG. 6 is a graph of the temperature versus time operational characteristics of the oscillator package 300 in accordance with the present invention. Line 710 represents the temperature at temperature sensor 22. The temperature at temperature sensor 20 is shown by line 720. Line 730 represents the thermal lag time between the sensors 20 and 22.

The thermal lag time that exists between temperature sensors 20 and 22 can be correlated to the thermal lag time between temperature sensor 22 and resonator 250. A correction can be made because the thermal lag time between resonator 250 and temperature sensor 22 can be determined by the thermal lag time between temperature sensors 20 and 22. If the thermal lag time from sensor 20 to resonator 250 is equal to the thermal lag time from temperature sensor 22 to 20, then the thermal lag is readily compensated for.

Since the crystal temperature response to a change in the temperature of the external environment acts similar to a dampened electrical circuit, a resistor-capacitor filter with the correct response can be used to modify the normal temperature correction voltage during the presence of changing temperatures.

A second order filter can be designed such that the error for a constant rate of change of temperature is nearly zero. A multi-sensor correction signal could also be generated using digital filters to derive the actual crystal temperature based upon the data from multiple temperature sensors and then applying the filtered signal to the temperature compensation circuit.

The environment containing oscillator package 300 should be controlled to the extent that the temperature gradients seen by the oscillator components are consistent and repeatable. This same restriction is necessary for all TCXO oscillators to function within a reasonable frequency tolerance. Preferably, temperature sensors 20 and 22 are mounted within oscillator package 300 such that the temperature gradient between temperature sensors 20 and 22 is maximized.

There are several advantages to the use of oscillator package 10: it eliminates the need to locate the temperature sensor as close as possible to the resonator because the actual resonator temperature can be derived; oscillator package 10 provides for a more stable output frequency with changes in temperature because the actual resonator temperature can be derived and used to control the temperature compensation circuit; and oscillator package 10 is adapted to provide a stable output frequency tolerance in the range between 0.1 to 0.2 PPM.

Method of Operation

Figure 7:
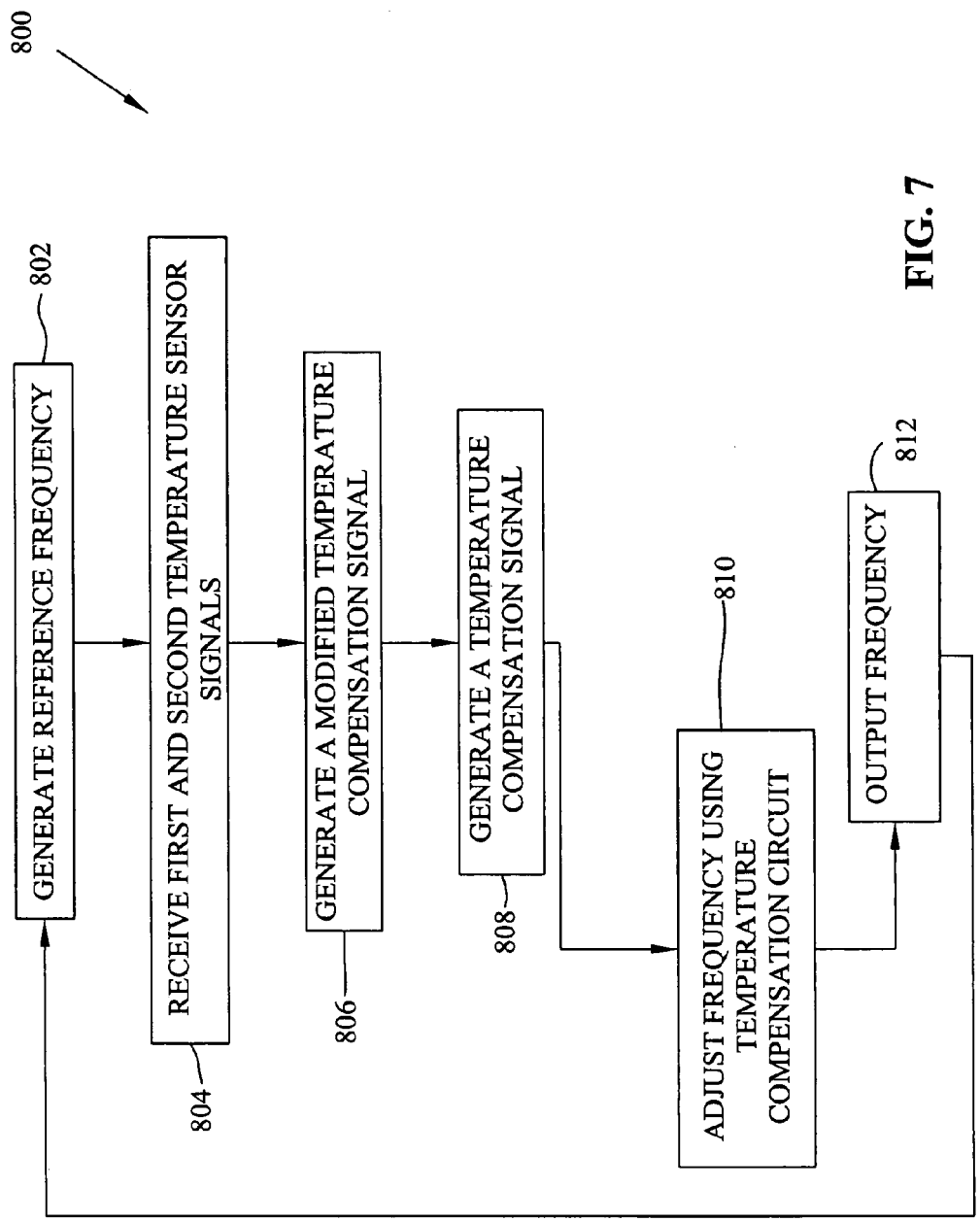
FIG. 7 is a flowchart of a method of operating a TCXO package in accordance with the present invention.

A method of operating an oscillator in accordance with the present invention will now be described with reference to FIGS. 1 and 7. At initial step 802, oscillator 200 of FIG. 1 generates a reference frequency. Then, in accordance with the present invention, a first temperature is sensed on one side of the resonator by the first temperature sensor and in proximity to the resonator for sensing the change in ambient temperature before the resonator starts to react to the temperature change. Optionally, at least a second temperature sensor is located on the opposite side of the resonator and in proximity to the oscillator circuit for sensing the temperature on the opposite side of the resonator.

The temperature sensor signals from temperature sensors 20 and 22 are then received by temperature sensor signal modification circuit 50 at step 804. At the next step 806, temperature sensor signal modification circuit 50 generates a modified temperature sensor signal. The modified temperature sensor signal is generated from the first and optional second temperature signals generated by the first and optional second temperature sensors 20 and 22.

It is a feature of this invention that the modified temperature sensor signal nearly perfectly matches the actual temperature of the resonator by modifying the temperature sensor signal through a thermal model of the oscillator assembly. By modifying the temperature sensor signal to match the thermal delay characteristics of the resonator as it responds to changes in ambient temperature, the appropriate correction can be applied for frequency stability. The addition of an optional second temperature sensor 22 on the opposite side of the resonator as the first temperature sensor 20 allows for the sensing of the temperature gradient across (i.e., on opposite sides on the resonator and allows for the actual resonator temperature to be predicted with greater accuracy.

The modified temperature sensor signal is provided to temperature compensation circuit 100 and a temperature compensation signal is generated at step 808.

At step 810, temperature compensation circuit 100 adjusts the reference frequency of oscillator circuit 200. At step 812, the reference frequency is outputted to terminal 202. The entire frequency generation and adjustment cycle described above is then repeated as desired.

While the invention has been taught with specific reference to the above embodiment, someone skilled in the art will recognize that changes can be made in form and detail without departing from the spirit and the scope of the invention. The described embodiment is to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An oscillator comprising:
   a resonator adapted to respond to a change in temperature;
   an oscillator circuit connected to the resonator and operable to produce an output frequency;
   a temperature compensation circuit associated with the oscillator circuit, the temperature compensation circuit being adapted to stabilize the output frequency in response to changes in temperature;
   at least a first temperature sensor which senses the change in temperature before the resonator responds to the change in temperature; and
   a temperature sensor signal modification circuit associated with the first temperature sensor and the temperature compensation circuit, the temperature sensor signal modification circuit being adapted to receive a first temperature signal from the first temperature sensor and generate a modified temperature sensor signal that is transmitted to the temperature compensation circuit, the temperature sensor signal modification circuit being adapted to approximate the thermal lag time between the change in temperature sensed by the first temperature sensor and the response of the resonator to the change in temperature.

2. The oscillator according to claim 1, wherein the temperature sensor signal modification circuit includes a combination of a resistor and a capacitor with a time constant which approximates the thermal lag time between the change in temperature sensed by the first temperature sensor and the response of the resonator to the change in temperature.

3. The oscillator according to claim 1, wherein the first temperature sensor is a semiconductor device adapted to produce a voltage or current proportional to the temperature sensed.

4. An oscillator comprising:
a resonator;
an oscillator circuit connected to the resonator and operable to produce an output frequency;
a temperature compensation circuit associated with the oscillator circuit, the temperature compensation circuit being adapted to stabilize the output frequency in response to changes in temperature;
at least a first temperature sensor; and
a temperature sensor signal modification circuit associated with the first temperature sensor and the temperature compensation circuit, the temperature sensor signal modification circuit being adapted to receive a first temperature signal from the first temperature sensor and generate a first temperature sensor signal that is transmitted to the temperature compensation circuit, the temperature sensor signal modification circuit further comprising:
a first amplifier adapted to receive the first temperature signal and generate a first amplifier output signal;
a second amplifier connected to the first amplifier and adapted to receive the first amplifier output signal and generate a second amplifier output signal; and
a third amplifier connected to the first and second amplifiers and adapted to receive the first temperature signal and the second amplifier output signal and generate the modified temperature sensor signal.

5. The oscillator according to claim 1, wherein the modified temperature sensor signal compensates for the thermal gradient between the resonator and the first temperature sensor.

6. An oscillator comprising: a resonator; an oscillator circuit connected to the resonator and operable to produce an output frequency; a temperature compensation circuit associated with the oscillator circuit, the temperature compensation circuit being adapted to stabilize the output frequency in response to changes in temperature; at least a first temperature sensor; a temperature sensor signal modification circuit associated with the first temperature sensor and the temperature compensation circuit, the temperature sensor signal modification circuit being adapted to receive a first temperature signal from the first temperature sensor and generate a modified temperature sensor signal that is transmitted to the temperature compensation circuit, the modified temperature sensor signal compensating for the thermal gradient between the resonator and the first temperature sensor; and a second temperature sensor adapted to produce a second temperature signal, a first amplifier being adapted to receive the second temperature signal and generate a first amplifier output signal, the thermal gradient between the resonator and the first temperature sensor being approximately the same as the thermal gradient between the first temperature sensor and the second temperature sensor.

7. An oscillator, comprising:
frequency stabilizing means for stabilizing a reference frequency;
oscillator circuit means connected to the frequency stabilizing means and adapted to generate the reference frequency;
temperature compensation means connected to the oscillator circuit means for adjusting the reference frequency in response to a change in temperature;
temperature sensor means for sensing a temperature and generating at least one temperature sensor signal, the temperature sensor means being adapted to sense the change in temperature before a response by the frequency stabilizing means to the change in temperature; and
temperature sensor signal modification means connected to the temperature sensor means and the temperature compensation means, the temperature sensor signal modification means receiving the temperature sensor signal and generating a modified temperature sensor signal that is provided to the temperature compensation means and approximates the thermal lag time between the change in temperature sensed by the temperature sensor means and the response of the frequency stabilizing means to the change in temperature.

8. The oscillator according to claim 7, wherein the oscillator circuit means includes:
a transistor;
a resistor feedback network connected to the transistor; and
a varactor.

9. The oscillator according to claim 7, wherein the temperature sensor means comprises:
a first temperature sensor adapted to generate a first temperature sensor signal; and
a second temperature sensor adapted to generate a second temperature sensor signal.

10. An oscillator comprising:
frequency stabilizing means for stabilizing a reference frequency;
oscillator circuit means connected to the frequency stabilizing means and adapted to generate the reference frequency;
temperature compensation means connected to the oscillator circuit means for adjusting the reference frequency in response to a change in temperature;
temperature sensor means comprising a first temperature sensor adapted to generate a first temperature sensor signal and a second temperature sensor adapted to generate a second temperature sensor signal; and
temperature sensor signal modification means connected to the temperature sensor means and the temperature compensation means, the temperature sensor signal modification means receiving the temperature sensor signal and generating a modified temperature sensor signal that is provided to the temperature compensation means, the temperature sensor signal modification means comprising:
a first amplifier adapted to receive the first and second temperature signals and generate a first amplifier output signal;
a second amplifier connected to the first amplifier and adapted to receive the first amplifier output signal and generate a second amplifier output signal; and
a third amplifier connected to the first and second amplifiers and adapted to receive the first temperature signal and the second amplifier output signal and generate the modified temperature sensor signal.

11. The oscillator according to claim 9, wherein the first temperature sensor is located in proximity to the frequency stabilizing means.

12. The oscillator according to claim 11, wherein the second temperature sensor is located in proximity to the oscillator circuit means.

13. A method of temperature compensating an oscillator comprising the steps of:

providing an oscillator circuit in communication with a resonator adapted to respond to chances in temperature;

generating a reference frequency from the oscillator circuit;

sensing at least a first change in temperature, the response of the resonator to the at least first change in temperature following the sensing of the at least first change in temperature;

generating a first temperature sensor signal from the at least first sensed change in temperature;

generating a second temperature sensor signal from the first temperature sensor signal which has been modified to match the thermal delay between the sensing of the at least first change in temperature and the response of the resonator to the at least first change in temperature;

generating a temperature compensation voltage from the second temperature sensor signal; and adjusting the reference frequency using the temperature compensation voltage.

* * * * *

UNITED STATES PATENT AND TRADEMARK OFFICE
CERTIFICATE OF CORRECTION

| | | |
|---|---|---|
| PATENT NO. | : 7,649,426 B2 | Page 1 of 1 |
| APPLICATION NO. | : 11/899109 | |
| DATED | : January 19, 2010 | |
| INVENTOR(S) | : James L. Stolpman | |

It is certified that error appears in the above-identified patent and that said Letters Patent is hereby corrected as shown below:

Column 8, line 17, "sides on" should be changed to --sides of)--

Signed and Sealed this
Thirteenth Day of March, 2012

David J. Kappos
*Director of the United States Patent and Trademark Office*